(12) United States Patent
Chien

(10) Patent No.: US 6,599,588 B2
(45) Date of Patent: Jul. 29, 2003

(54) METHOD FOR SURFACE TREATMENT OF METAL ENCLOSURE

(75) Inventor: Wen-Shan Chien, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 49 days.

(21) Appl. No.: 10/051,831

(22) Filed: Jan. 16, 2002

(65) Prior Publication Data

US 2003/0082313 A1 May 1, 2003

(30) Foreign Application Priority Data

Oct. 31, 2001 (TW) ........................................ 90126990 A

(51) Int. Cl.[7] ................................................ H05H 1/02
(52) U.S. Cl. ............... 427/574; 427/255.29; 427/255.4; 427/295; 427/309; 427/314; 427/318; 427/327; 427/430.1; 427/435; 427/443.2; 427/578
(58) Field of Search ................................ 427/573, 574, 427/578, 255.29, 255.4, 295, 309, 318, 314, 327, 435, 443.2, 430.1

(56) References Cited

U.S. PATENT DOCUMENTS

| 4,377,723 A | * | 3/1983 | Dalal | 136/249 |
| 4,563,367 A | * | 1/1986 | Sherman | 427/39 |
| 4,978,358 A | * | 12/1990 | Bobyn | 623/23 |

* cited by examiner

Primary Examiner—Bernard Pianalto

(57) ABSTRACT

A method for treating a metal enclosure to prevent the enclosure from being contaminated, comprises the steps of: (a) sand-blasting the enclosure; (b) preheating the enclosure to a predetermined temperature, and putting the enclosure into the space in a vacuum chamber between two electrodes; (c) introducing reactive gases into the vacuum chamber, the reactive gases including 1,1,3,3-tetramethyldisiloxane and oxygen; (d) applying high electrical power to the electrodes to cause the reactive gases to become an ionized plasma, the plasma reacting with a surface of the enclosure to form a layer of silicon oxide thereon. The layer of silicon oxide resists formation of a fingerprint when it is touched by a user.

11 Claims, 3 Drawing Sheets

METHOD FOR SURFACE TREATMENT OF METAL ENCLOSURE

BACKGROUND OF THE INVENTION

1. Field of the Invention

The present invention relates to a method for surface treatment of a metal enclosure, and particularly to a method of surface treatment which protects an outer face of the enclosure from contamination, erosion and abrasion.

2. Related Art

Many different metallic materials such as steel and aluminum are widely used as enclosures for portable electronic apparatuses such as mobile phones and personal digital assistants (PDAs). Enclosures made of such materials are usually treated by way of electroplating to provide better surface features. However, a conventional electroplated coating formed on the surface of an enclosure is frequently not durable.

U.S. Pat. No. 5,783,313 discloses a coated article. The coating includes a combination of nickel and palladium layers. The article can have improved brightness and resistance to abrasion.

However, the coating is susceptible to fingerprint contamination. That is, fingerprints are easily formed and left on the coating. This adversely affects the aesthetic appearance of the article. Furthermore, the corrosion and wear resistance of the coating falls short of increasingly stringent requirements imposed by modern industrial standards.

Accordingly, an improved surface treatment of a metal enclosure which overcomes the above-mentioned problems is desired.

BRIEF SUMMARY OF THE INVENTION

Accordingly, an object of the present invention is to provide a method for treating a metal enclosure which renders the enclosure fingerprint resistant.

Another object of the present invention is to provide a method for treating a metal enclosure which renders the enclosure resistant to corrosion and abrasion.

To achieve the above-mentioned objects, a method for treating a metal enclosure according to the present invention comprises the steps of: (a) sand-blasting the enclosure; (b) preheating the enclosure to a predetermined temperature, and putting the enclosure into the space in a vacuum chamber between two electrodes; (c) introducing reactive gases into the vacuum chamber, said reactive gases comprising 1,1,3,3-tetramethyldisiloxane and oxygen; and (d) applying high electrical power to the electrodes to cause the reactive gases to become an ionized plasma, said plasma reacting with a surface of the metal enclosure to form a layer of silicon oxide thereon. The layer of silicon oxide resists formation of a fingerprint when it is touched by a user.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
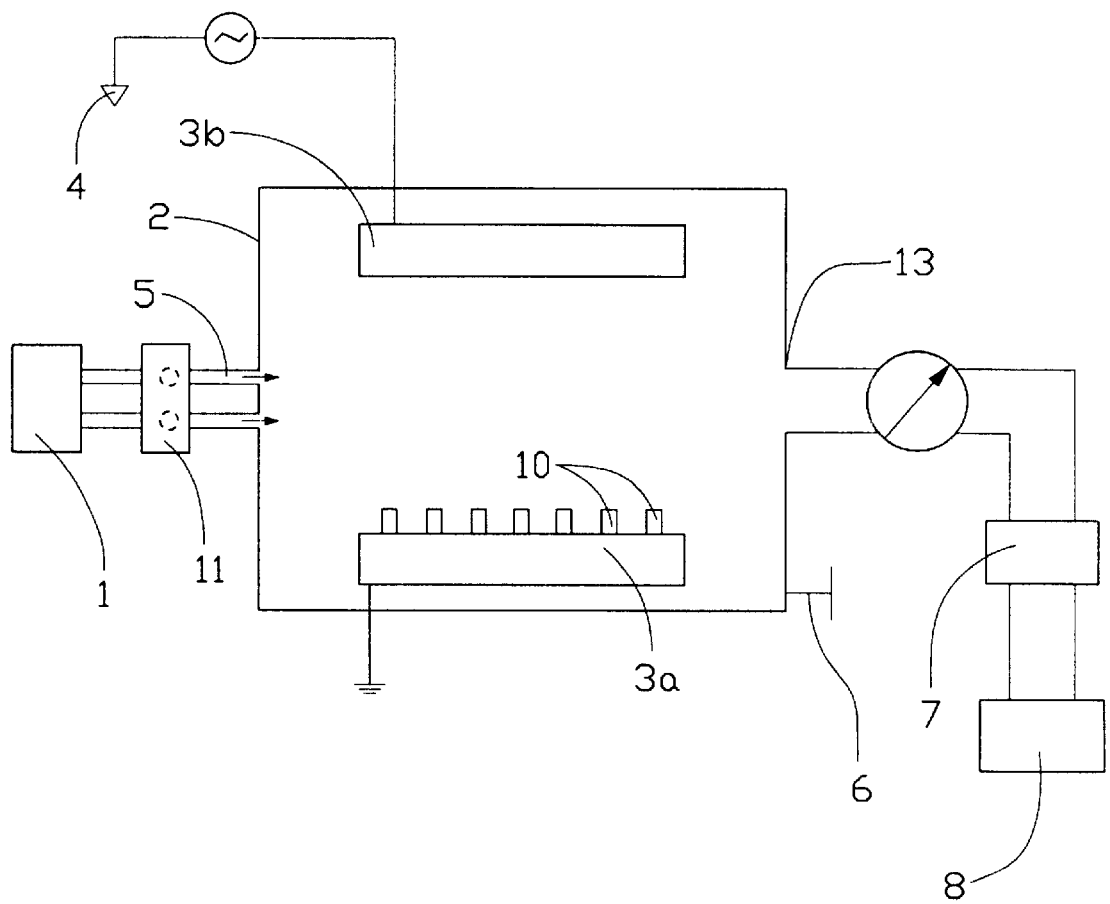
FIG. 1 is a schematic view of an apparatus for carrying out a method for surface treatment of a metal enclosure according to the present invention.

FIG. 1 shows an apparatus for surface treatment of a metal enclosure 10. The apparatus includes a vacuum chamber 2, and a pair of electrodes 3a, 3b mounted at opposite lower and upper positions in the chamber respectively. When radio frequency (RF) electrical power from a high frequency electrical power source 4 is applied to the electrodes 3a, 3b, reactive gases introduced into the chamber 2 between the electrodes 3a, 3b are converted into plasma.

The electrode 3a is grounded, and serves as a table supporting the enclosure 10. The electrode 3b is connected to the power source 4. The reactive gases are introduced from a gas source 1 through gas inlets 5 into the vacuum chamber 2. A distributor 11 is positioned between the gas source 1 and the gas inlets 5 so that a volumetric flow rate of the reactive gases can be controlled.

The vacuum chamber 2 has an outlet 13 which is connected to a pump 8 through a valve 7, so that the vacuum chamber 2 can be pumped under a predetermined pressure. An exhaust port 6 is connected to an exhausting apparatus (not shown), to expel wasted gases and keep the chamber 2 at a predetermined pressure.

Figure 2:
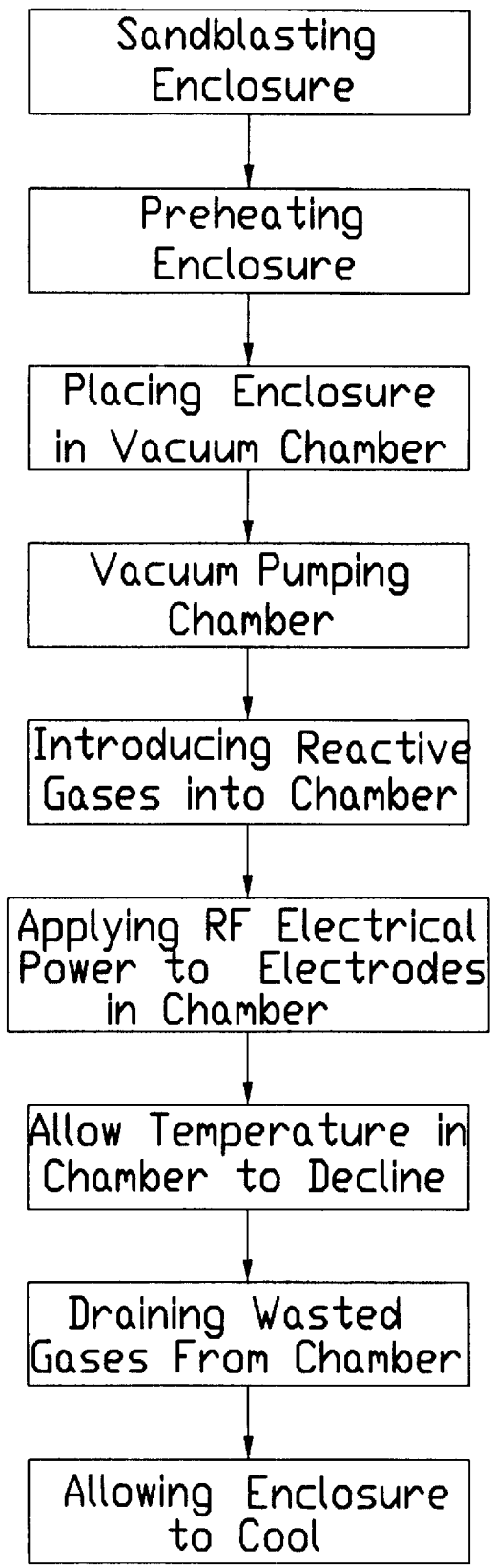
FIG. 2 is a flow chart of the method according to the present invention.

Referring to FIG. 2, a method in accordance with the present invention for treating the enclosure 10 comprises the following steps:

1. The enclosure 10 is subjected to a sandblasting process. Sand used in this processing is dry quartz sand, which is blasted onto the enclosure 10 under a pressure of 0.15~0.3 MegaPascals (MPa) for 3~5 minutes. The sandblasted enclosure 10 is then immersed in sodium carbonate ($Na_2CO_3$) solution for further treatment.

2. The enclosure 10 is taken out from the $Na_2CO_3$ solution and preheated to a temperature in the range of 100° C.~200° C. by a heating apparatus (not shown). The enclosure 10 is then placed on the electrode 3a. The vacuum pump 8 is started, and pumps the vacuum chamber 2 until the vacuum chamber 2 reaches a pressure in the range of 2.67~1333.2 Pascals (Pa).

3. Reactive gases 1,1,3,3-tetramethyldisiloxane (TMDS) and oxygen ($O_2$) are introduced into the vacuum chamber 2 from the gas source 1 via the distributor 11 and the inlets 5. A ratio of volumetric flow rates of TMDS and $O_2$ is 2:5. In the preferred embodiment, the volumetric flow rate of TMDS is maintained in the range of 50~150 standard cubic centimeters per minute (SCCM), and the volumetric flow rate of $O_2$ is maintained at 200~300 SCCM. Both of these volumetric flow rates are maintained by adjusting the distributor 11.

4. RF power from the power source 4 having a magnitude of 500 watts (W) and a frequency of 13.56 Megahertz (MHz) is applied to the electrodes 3a, 3b. The reactive gases TMDS and $O_2$ which flow between the electrodes 3a, 3b are ionized into an ionized plasma. The plasma reacts with a surface of the enclosure 10, and a layer of silicon oxide 12 (see FIG. 3) is formed on the surface. The power is applied to the electrodes 3a, 3b for about 50 minutes, therefore the reaction between the plasma and surface of the enclosure 10 proceeds for about 50 minutes. A temperature in the vacuum chamber 2 declines during the period of about 50 minutes. After the period of about 50 minutes has expired, the RF power is cut from the electrodes 3*a*, 3*b*.

5. The exhaust port 6 is opened to drain the wasted gases from the chamber 2. Finally, the treated enclosure 10 is taken out from the chamber 2 after it has cooled.

Figure 3:
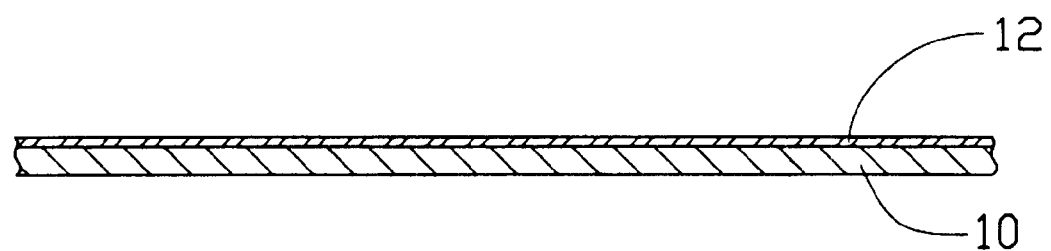
FIG. 3 is a cross-sectional view of a portion of the metal enclosure after being treated by the method according to the present invention.

Referring to FIG. 3, a layer of silicon oxide 12 is formed on the surface of the enclosure 10 after the above treatment. This gives the surface of the enclosure 10 increased brightness. It also gives the enclosure 10 improved corrosion resistance. Furthermore, when the enclosure 10 is touched or gripped by a user's fingers or hand, the enclosure 10 resists formation of visible fingerprints or handprints thereon. Thus when the enclosure 10 is used with an accompanying electronic apparatus, the enclosure 10 provides a consistent attractive appearance for the electronic apparatus. These advantages of the present invention are particularly evident when the enclosure 10 is made of aluminum alloy or titanium alloy.

It is believed that the present invention and its advantages will be understood from the foregoing description, and it will be apparent that various changes may be made thereto without departing from the spirit and scope of the invention or sacrificing all of its material advantages. Accordingly, the examples hereinbefore described are to be understood as being preferred or exemplary embodiments of the invention.

What is claimed is:

1. A method for treating a metal enclosure to prevent the enclosure from being contaminated, the method comprising the steps of:
   (a) sand-blasting the enclosure;
   (b) preheating the enclosure to a predetermined temperature, and putting the enclosure into a space in a vacuum chamber between two electrodes;
   (c) introducing reactive gases into the vacuum chamber, said reactive gases comprising 1,1,3,3-tetramethyldisiloxane and oxygen;
   (d) applying high electrical power to the electrodes to cause the reactive gases to become an ionized plasma, said plasma reacting with a surface of the enclosure to form a layer of silicon oxide thereon; whereby the layer of silicon oxide resists formation of a fingerprint when it is touched by a user.

2. The method of claim 1, wherein in step (b) the enclosure is preheated to a temperature in the range from 100° Centigrade to 200° Centigrade.

3. The method of claim 1, wherein a temperature in the vacuum chamber declines during the process of treatment.

4. The method of claim 1, wherein in steps (c) and (d), the vacuum chamber is maintained at a pressure between 2.67 and 1333.2 Pascals.

5. The method of claim 1, wherein the high electrical power has a frequency of 13.56 Megahertz.

6. The method of claim 1, wherein in step (c), a ratio of volumetric flow rates of 1,1,3,3-tetramethyldisiloxane and oxygen introduced into the vacuum chamber is approximately 2:5.

7. The method of claim 1, wherein the enclosure is made of aluminum alloy.

8. The method of claim 1, wherein the enclosure is made of titanium alloy.

9. The method of claim 1, wherein in step (a), the sandblasting is carried out by spraying dry quartz sand onto the enclosure under a pressure in the range of 0.15 to 0.3 MegaPascals for a period in the range of 3 to 5 minutes.

10. The method of claim 1, further comprising the following step between steps (a) and (b):
    immersing the enclosure into a sodium carbonate solution.

11. The method of claim 1, further comprising the following step after formation of a layer of silicon oxide on the enclosure in step (d):
    draining wasted gases from the vacuum chamber.

* * * * *